(12) United States Patent
Ciccarelli et al.

(10) Patent No.: US 7,965,107 B2
(45) Date of Patent: Jun. 21, 2011

(54) BASE CELL FOR ENGINEERING CHANGE ORDER (ECO) IMPLEMENTATION

(75) Inventors: Luca Ciccarelli, Rimini (IT); Lorenzo Cali, Besana Brianza (IT); Massimiliano Innocenti, Urbino (IT); Claudio Mucci, Bologna (IT); Valentina Nardone, Monza (IT); Matteo Pizzotti, Riccione (IT); Pankaj Rohilla, Uttar Pradesh (IN)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 12/648,075

(22) Filed: Dec. 28, 2009

(65) Prior Publication Data

US 2010/0164547 A1    Jul. 1, 2010

(30) Foreign Application Priority Data

Dec. 30, 2008  (IT) .............................. MI2008A2357

(51) Int. Cl.
*H01L 25/00*   (2006.01)
*H03K 19/00*   (2006.01)

(52) U.S. Cl. .............. 326/101; 326/102; 326/9; 326/38; 326/39

(58) Field of Classification Search ........... 326/101–103
See application file for complete search history.

(56) References Cited

U.S. PATENT DOCUMENTS

| | | | |
|---|---|---|---|
| 5,502,404 A * | 3/1996 | Landers et al. ................ 326/50 |
| 6,255,845 B1 | 7/2001 | Wong et al. |
| 2005/0189569 A1 | 9/2005 | Hartwig |
| 2005/0235240 A1 | 10/2005 | Tien |
| 2006/0027835 A1 | 2/2006 | Yamagami |
| 2007/0157151 A1 | 7/2007 | Kim |
| 2007/0300202 A1 * | 12/2007 | Uchida ........................ 716/17 |

* cited by examiner

*Primary Examiner* — Anh Q Tran
(74) *Attorney, Agent, or Firm* — Lisa K. Jorgenson; E. Russell Tarleton; Seed IP Law Group PLLC

(57) ABSTRACT

A base cell for an Engineering Change Order (ECO) implementation having at least a first pair of CMOS transistors and a second pair of CMOS transistors, characterized in that said at least first pair of CMOS transistors have a common gate and said at least second pair of CMOS transistors have separate gates.

20 Claims, 4 Drawing Sheets

BASE CELL FOR ENGINEERING CHANGE ORDER (ECO) IMPLEMENTATION

BACKGROUND

1. Technical Field

The present disclosure relates to a base cell for an Engineering Change Order (ECO) implementation and, more particularly but non exclusively, relates to a mask programmable base cell for Engineering Change Order (ECO) post-silicon implementation, and the following description refers to this application field only to simplify the explanation.

2. Description of the Related Art

As it is well known, demands of consolidating functions and applications from printed circuit board to a single chip are growing stronger. These demands have made Integrated Circuit (IC) scales and designs increasingly complex and time consuming. For this reason, Computer-Aided Design (CAD) has become a necessary tool to speed up and improve the quality of IC design. In particular, physical layout takes up a major portion of the cycle of designing an Application Specific Integrated Circuit (ASIC).

In creating a physical layout of an ASIC, a computer layout may be first generated generally by arranging a number of individual blocks or "logic cells" based on designated schematics. The functionality and design of individual logic cells may be predetermined and stored on a computer system as a standardized cell design. Such cell design techniques can save time in design cycle, as it may be no longer necessary for an IC designer to custom design each individual gate and transistor in an integrated circuit. Rather, the circuit designer breaks down a new circuit design into a number of known (or new) cell designs and then combines these cells appropriately to generate a circuit layout that performs a desired function.

Each of the logic cells contains a number of terminals for implementing into the IC.

To release the layout to mask making for semiconductor processing, the data is loaded in a "tape," and it is given to a mask shop, the so-called "tape-out phase."

To tape-out such a computer layout, commercial place-and-route CAD tools are used. More particularly, place-and-route CAD programs are used to arrange logic cells and other elements to optimize their interconnections, overall size, and to define the routing region and select channels to connect the logic cells and elements.

A place-and-route CAD tool requires as input a predetermined number of predefined logic cell types (e.g., Inverter, NAND, NOR, XOR, Multiplexer, flip-flop, Decap, etc.) to implement the tasks mentioned above. In response, the place-and-route CAD tool outputs a computer layout.

Using the computer layout generated as a blueprint, a number of basic CMOS transistor layers, contact, and metal layers defining the elements and interconnections of the IC are created in silicon through a combination of semiconductor processes, including depositing, masking, and etching. When combined, these layers form the IC with the desired functionality.

Depending on the complexity of the ASIC, each circuit may involve multiple basic layers, multiple contacts, and multiple metal layers. This layer-patterns-release procedure is widely known as "tape-out."

Following tape-out, for various reasons including design changes, modifications are subsequently required to delete as well as add logic elements and interconnections from the original design.

When this occurs, an Engineering Change Order (ECO) is generated to document the desired changes.

Next, the earlier generated computer layout is modified using the commercial place-and-route CAD tool to incorporate the desired changes.

Under conventional methods, extra logic cells, or filler cells, of different types are included in the original computer layout as reserves in case new elements are needed. However, due to limitations inherent in the software environment, the place-and-route CAD tool requires that these extra logic cells be of the predefined types and numbers.

Because the types of the logic cells are predefined as Inverter, NAND, NOR, XOR, Multiplexer, flip-flop, Decap, etc., modifications are limited to changing the logic cells connectivity. Such inflexibility may cause negative consequences.

For instance, in adding logic elements as required under an ECO, a logic cell of a certain type may not be available for implementing a desired function. As a result, either the desired function must be deleted or the process of generating a computer layout with the desired logic cells must be restarted and, of course, neither one of these options is desirable.

In addition, even if the correct type logic cells are available for adding, the layout engineer must still make the proper connections; however, because the locations of the logic cells are fixed, it is sometimes not possible to provide the desired connections given existing obstacles and various space constraints in the layout. Moreover, it is a painful and time-consuming task to identify the extra logic cells and provide the proper wiring to properly connect the added cells.

Because of the increasing complexity of the IC design and modification, the turn-around time to incorporate the desired ECO changes is generally high.

Many attempts to implement the desired ECO changes to a device layout design and to create a flexible ECO base cell have been made in order to obtain a shorter product life cycle and costs reduction.

A known solution is described in U.S. Patent Application Publication Number US 2005/0235240 in the name of Taiwan Semiconductor Manufacturing Co., Ltd. This patent application discloses an ECO base cell module, shown in the annexed FIG. 1.

The cell 100 has a virtual center line 102 with respect to which all patterns of material layers are mirrored in a symmetrical way. Moreover, the cell 100 includes an N-well 104 wherein one or more PMOS transistors may be formed and a P-well 106 wherein one or more NMOS transistors may be formed, a P+ implant region 110 that forms the source and drain regions for PMOS transistors, an N+ implant region 112 that forms the source and drain regions for NMOS transistors, a MOS channel region formed by a polysilicon layer 108 together with a gate oxide, an N-well pick-up region formed by the N+ implant 112 together with contacts 114 and a P-well pick-up region formed by the P+ implant 110 together with contacts 118. The cell 100 also includes a first power supply line VDD and a second power supply line VSS.

This known ECO base cell 100 has a same configuration as a standard logic cell and is alterable in at least one metal layer of the integrated structure forming it for realizing one or more connections to form a functional logic cell, like an Inverter, NAND, NOR, XOR, Multiplexer, flip-flop, de-coupling capacitors (Decap), etc.

In fact, in an original design, one or more logic cells (i.e., already configured cells) may be placed and connected through routing to form higher level functions, and one or more base cells (i.e., virgin cells) may also be placed in predetermined locations as fillers to prepare for future needed revisions.

During a design revision, the base cells can be transformed into logic or target cells through metal to silicon contacts, metal to polysilicon contacts, or other metal layer changes.

The modification of metal contact layers is a drawback of this known solution because it does not sufficiently reduce the costs and the fabrication time of the products. In addition, the base cell 100 as above described only allows the configuration of simple base cells, while the complex cells can be obtained only through the composition of these basic structures.

As a consequence, the construction of some complex cells, like three-state buffers, needs a very expensive implementation in terms of area occupation and an increase in the number of basic cells. This area increase reduces the flexibility of the ECO implementation and the number of logic cells available, increasing the routing resources needed in the ECO implementation, this being a very critical problem for design development.

The technical problem of the present disclosure is to provide a base cell layout for an Engineering Change Order (ECO) implementation having structural and functional features that provide a reduction in design revision time and costs, overcoming the limitations and drawbacks of the known solutions.

BRIEF SUMMARY

The present disclosure provides a base cell for an Engineering Change Order (ECO) implementation, the base cell including a first couple of MOS transistors having a common gate and a second couple of MOS transistors having separate gates. More particularly, the base cell layout has fixed contact layers, such as metal contact layer, and is mask programmable.

Based on this idea the technical problem is solved by a base cell for an Engineering Change Order (ECO) implementation, the base cell including at least a first plurality of CMOS transistors, such as a pair of CMOS transistors, and a second plurality of CMOS transistors, such as a second pair of CMOS transistors, the at least first plurality of CMOS transistors having a common gate and the at least second couple of CMOS transistors having separate gates.

Advantageously according to the disclosure, the base cell has fixed contact layers when making connections to form a functional cell.

Also advantageously according to the disclosure, the base cell includes first and second PMOS transistors and first and second NMOS transistors, the at least first plurality of CMOS transistors including the second PMOS transistor and the first NMOS transistor while the at least second couple of CMOS transistors includes the first PMOS transistor and the second NMOS transistor.

Also advantageously the first PMOS transistor has a source region isolated from all other MOS transistors with a source terminal, a dedicated gate region having a gate terminal and a drain region connected with the drain region of the second PMOS transistor through a common drain terminal.

Moreover, the second PMOS transistor has a source region isolated from all other MOS transistors with a source terminal.

Furthermore, the first NMOS transistor and the second PMOS transistor have a common gate region with a common gate terminal.

Also advantageously, the first NMOS transistor has a source region isolated from all other MOS transistors with a source terminal and a drain region connected with the drain region of the second NMOS transistor with a common drain terminal.

Moreover, the second NMOS transistor has a source region isolated from all other MOS transistors with a source terminal and a dedicated gate region having a gate terminal.

The technical problem is also solved by a complex functional logic cell for an Engineering Change Order (ECO) implementation characterized in that it includes a small cluster of base cells realized according to the disclosure, the cluster being composed by few and close base cells.

The complex functional logic cell can advantageously implement an inverting three-state buffer having a first PMOS transistor corresponding to the first PMOS transistor, a second PMOS transistor corresponding to the second PMOS transistor, a first NMOS transistor corresponding to the first NMOS transistor and a second NMOS transistor corresponding to the second NMOS transistor, in series with each other between a first and a second voltage supply, the first PMOS transistors and second NMOS transistor having common gates driven with a same first driving signal and the first NMOS transistor and second PMOS transistor having separate gates, respectively driven with a second driving signal and with its opposite.

Moreover, the complex functional logic cell can advantageously implement a flip-flop using only two metal layers of routing.

Furthermore, the complex functional logic cell can advantageously implement a multiplexer using three of the base cells.

The features and the advantages of the base cell according to the disclosure will be evident from the following description of a purely indicative and not limitative embodiment, referring to the attached drawings.

In accordance with the present disclosure, a circuit is provided that includes a base cell having a first pair of complementary MOS transistors and a second pair of complementary MOS transistors, the first and second pairs of transistors formed of patterns of material layers that is asymmetrical with respect to a longitudinal middle axis of the base cell.

In accordance with another aspect of the foregoing embodiment, the circuit includes the first pair of transistors having a common gate and a second pair of transistors having separate gates, the base cell having fixed contact layers that make connections to form a functional cell.

In accordance with another aspect of the foregoing embodiment, the circuit includes the first and second pairs of transistors including first and second PMOS transistors and first and second NMOS transistors in which the first pair of complementary MOS transistors include the second PMOS transistor and the first NMOS transistor, and the second pair of complementary MOS transistors includes the first PMOS transistor and the second NMOS transistor, and wherein the first PMOS transistor has a source region isolated from all other MOS transistors with a source terminal, a dedicated gate region having a gate terminal and a drain region connected with the drain region of the second PMOS transistor through a common drain terminal, and the second PMOS transistor has a source region isolated from all other MOS transistors with a source terminal.

In accordance with another aspect of the foregoing embodiment, the circuit includes the first NMOS transistor and the second PMOS transistor having a common gate region with a common gate terminal.

In accordance with another aspect of the foregoing embodiment, the circuit includes the first NMOS transistor having a source region isolated from all other MOS transistors with a source terminal and drain region connected with the drain region of the second NMOS transistor with a common drain terminal, and the second NMOS transistor having a source region isolated from all other MOS transistors with a source terminal and a dedicated gate region having a gate terminal.

DETAILED DESCRIPTION

Figure 2:
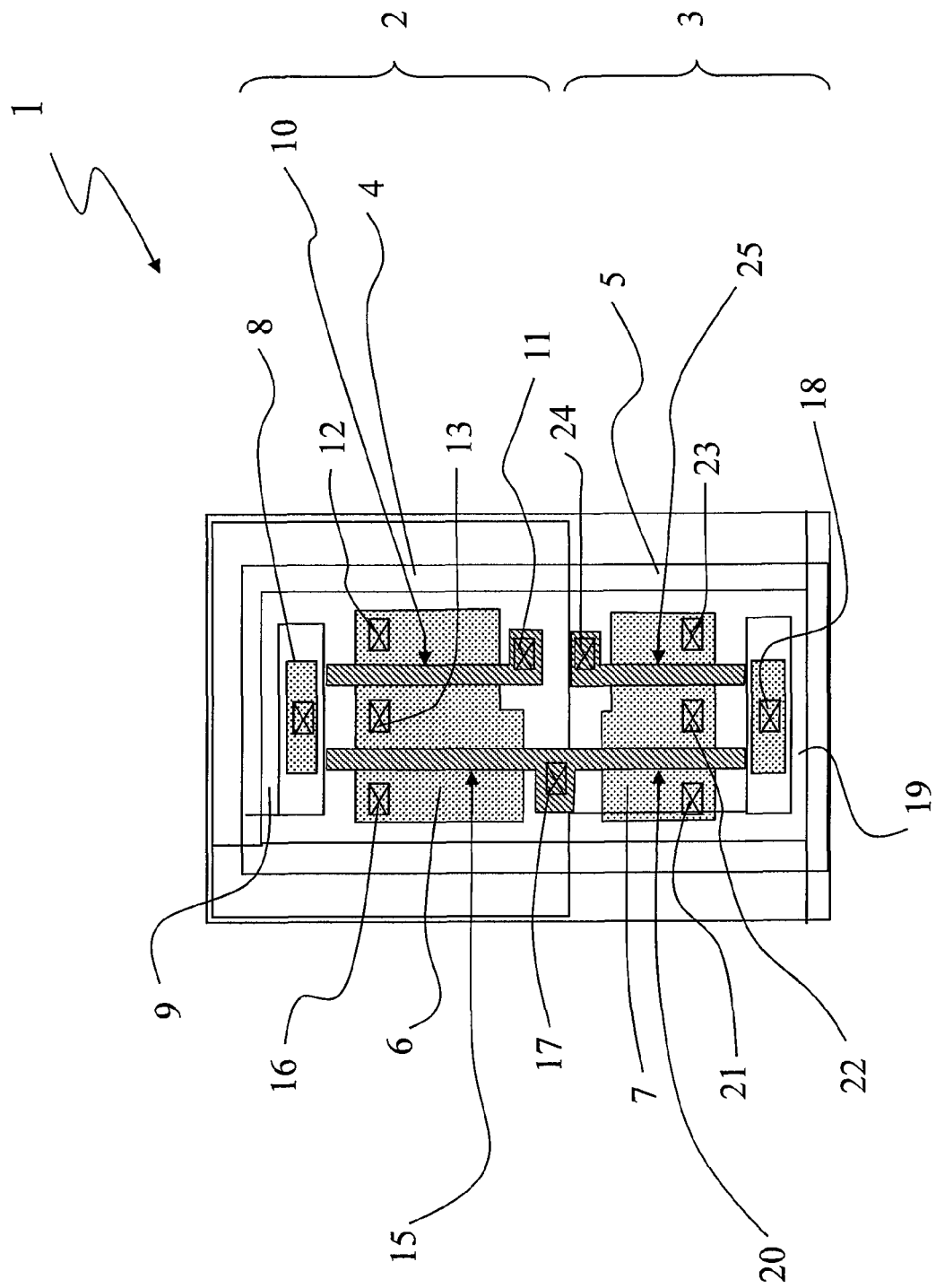
FIG. 2 shows a top view of an ECO base cell layout according to the disclosure.

Referring specifically to FIG. 2, a top view of a layout of a base cell 1 for an Engineering Change Order (ECO) implementation according to the present disclosure is shown. It should be noted that the base cell 1 is asymmetrical because of the lack of a virtual center line, with respect to which all patterns of material layers are symmetrically mirrored. In particular, according to this embodiment, the base cell 1 includes four devices such as NMOS transistors and PMOS transistors. A P side 2 and an N side 3 are thus defined in the base cell 1.

In particular, an N-well 4 provides a substrate wherein two PMOS transistors are formed and a P-well 5 provides a substrate wherein two NMOS transistors are formed. A P+ region 6 and an N+ region 7 are implanted on the substrates provided respectively by the N-well 4 and the P-well 5. In particular, the P+ implant of the P+ region 6 forms the source and drain regions of the PMOS transistors, as well as the N+ implant of the N+ region 7 forms the source and drain regions of the NMOS transistors.

The base cell 1 advantageously includes a first PMOS transistor 10, in turn having:
 a source region isolated from all other devices, namely the other MOS transistors, with a source terminal 11;
 a dedicated gate region having a gate terminal 12; and
 a drain region connected with a drain region of a second PMOS transistor 15 through a common drain terminal 13.

In addition, the second PMOS transistor 15 has a source region isolated from all other devices, namely the other MOS transistors, with a source terminal 16; and a gate region connected with the gate region of a first NMOS transistor 20, having a common gate terminal 17.

The first NMOS transistor 20 has a source region isolated from all other devices, namely the other MOS transistors, with a source terminal 21 and a drain region connected with a drain region of a second NMOS transistor 25, having a common drain terminal 22.

The second NMOS transistor 25 has a source region isolated from all other devices, namely the other MOS transistors, with a source terminal 23; and a dedicated gate region having a gate terminal 24.

The base cell 1 also includes a bulk contact 8 connecting the N-well 4 to a first voltage supply 9 and a bulk contact 18 connecting the P-well 5 to a second voltage supply 19.

Figure 1:
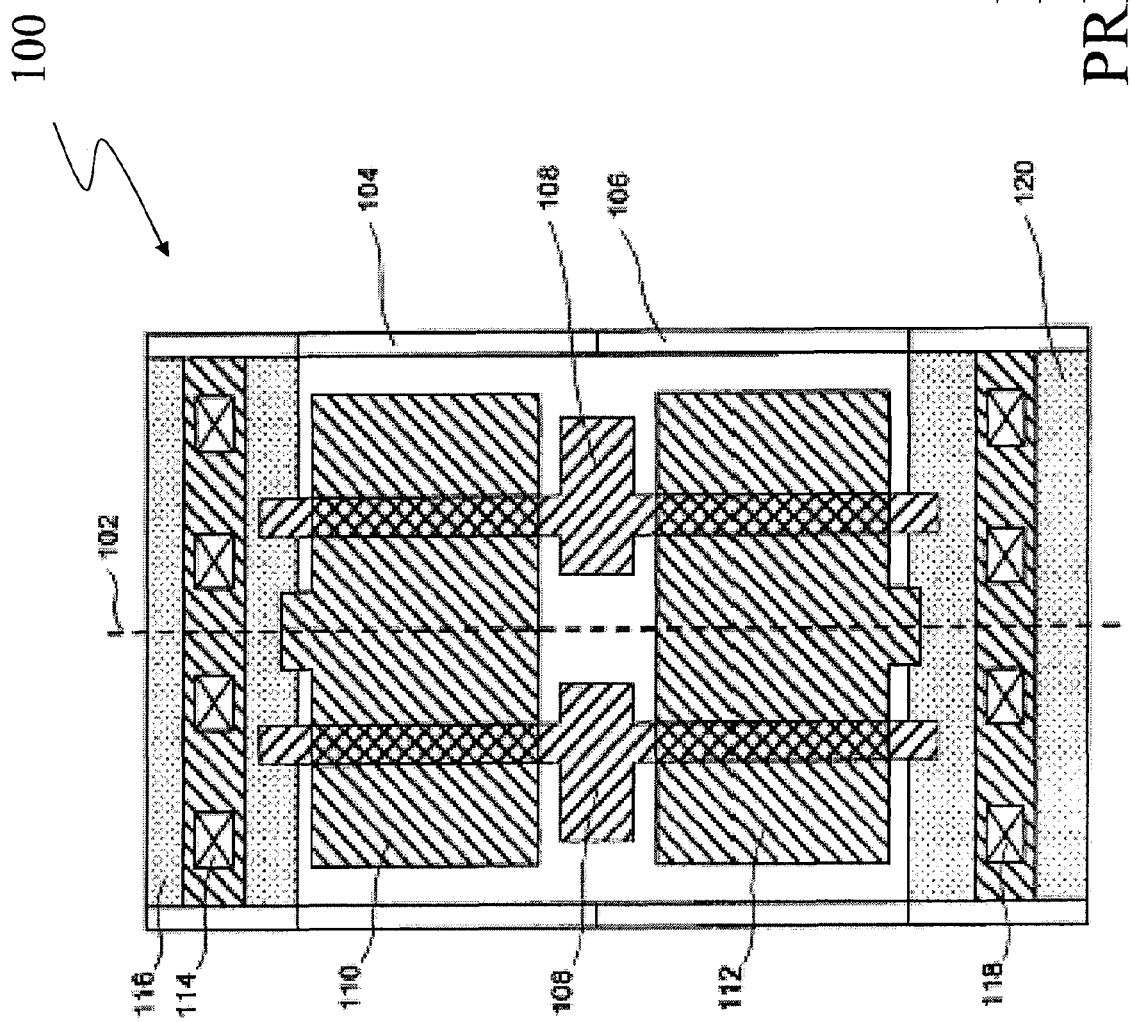
FIG. 1 shows a top view of an ECO base cell layout according to the prior art.

It should be emphasized that, advantageously according to the disclosure, the configuration of the base cell 1 shown in FIG. 1 allows the active area of the second PMOS transistor 15 and of the first NMOS transistor 20 to be higher than the active area of the first PMOS transistor 10 and of the second NMOS transistor 25. This is due to the fact that the common gate has a reduced area occupation, and a greater area is left free for implementing the active areas of the second PMOS transistor 15 and of the first NMOS transistor 20.

Also advantageously, the base cell 1 has a common gate terminal 17 for a first plurality of CMOS transistors, namely the second PMOS transistor 15 and the first NMOS transistor 20, and separate gates for a second plurality of CMOS transistors, namely the first PMOS transistor 10 and the second NMOS transistor 25 (independently driven MOS). Ideally the plurality of CMOS transistors in each instance is a complementary pair of MOS transistors, as described herein.

Advantageously, the base cell 1 has an asymmetric structure with respect to a possible middle symmetry axis, as the virtual center line of the known base cell described in the above prior art section, this configuration being useful to allow separate gate structures and not impacting the placement and routing efficiency of the base cell 1 itself.

Also advantageously, the base cell 1 has the layout layer up to contacts fixed, and it does not require the modification of the metal contact layer for the customization. In fact, all the front-end masks are well fixed and the ECO customization needs one less mask modification in respect of the prior known ECO base cell.

In a particularly advantageous application, the base cell according to the disclosure is used in a base $C^2MOS$ structure because the layout includes a common and separate gates being optimized for $C^2MOS$ applications.

Figure 3:
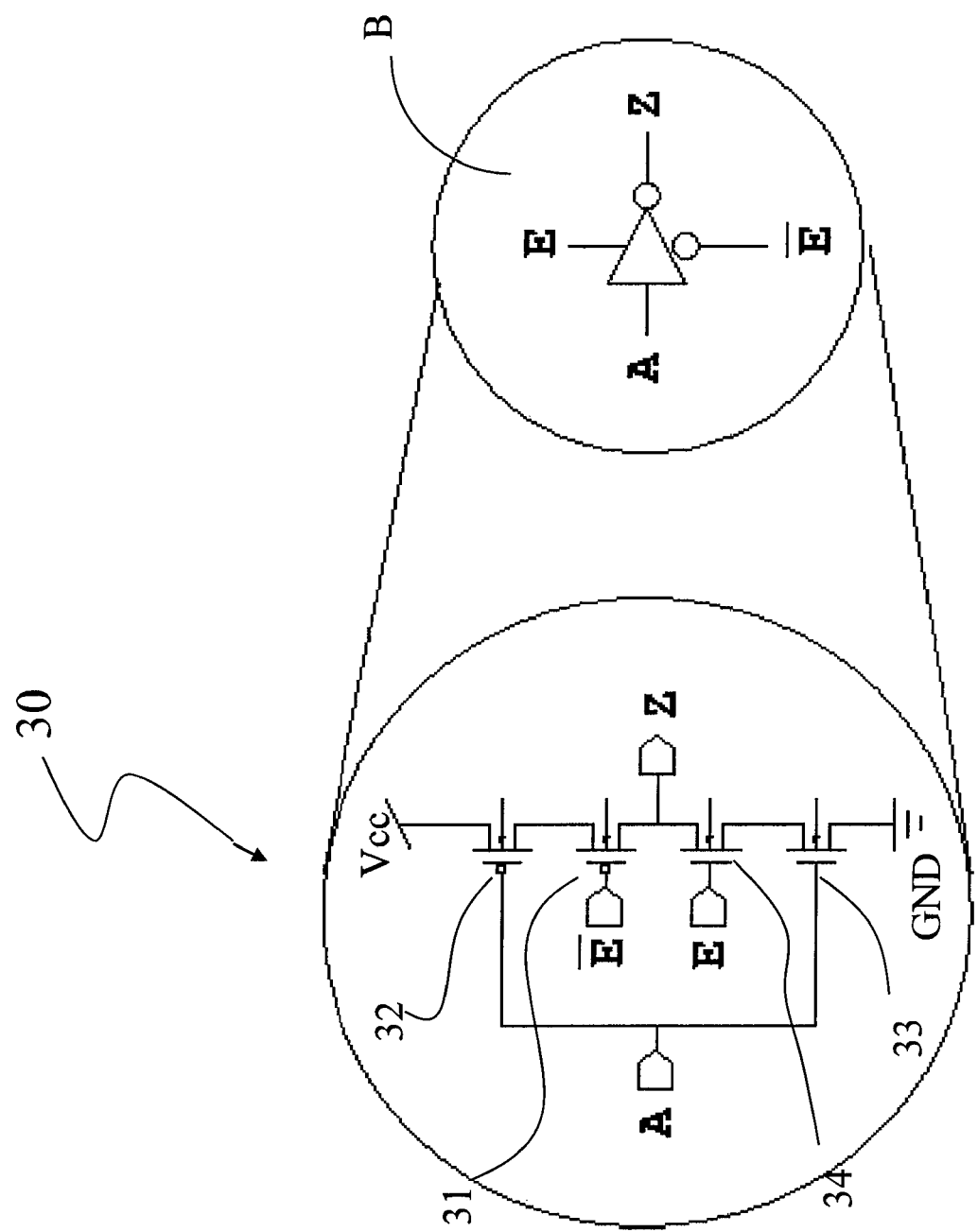
FIG. 3 shows a schematic view of a three-state inverting buffer implemented starting from the base cell of FIG. 2.

As a possible implementation of a base $C^2MOS$ structure using the base cell according to the disclosure, in FIG. 3 a three-state inverting buffer 30 is realized starting from a base cell 1 as shown, the commonly used symbol being indicated in portion B.

As will be clear from the following description, the base cell 1 allows implementing such a three-state inverting buffer 30, which is a base logic structure useful to implement a complex cell (for instance, flip-flop, multiplexer, . . . ) in an efficient manner in terms of the occupation area. Moreover, advantageously according to the disclosure, the three-state inverting buffer 30 of FIG. 3 keeps the same efficiency of a simple logic cell (for instance, NAND, NOR, inverter, buffer).

Advantageously according to the disclosure, the inverting three-state buffer 30 includes a first PMOS transistor 31, a second PMOS transistor 32, a first NMOS transistor 33 and a second NMOS transistor 34 in series with each other between a first and a second voltage supply, in particular a power supply Vcc and a ground GND. In particular, the second PMOS transistor 32 and the first NMOS transistor 33 have common gates driven with a same first driving signal A. Moreover, the second NMOS transistor 34 and the first PMOS transistor 31 have separate gates, respectively driven with a second driving signal E and with its opposite (inverted) driving signal $\overline{E}$.

In particular, the first PMOS transistor 31 corresponds to the first PMOS transistor 10 of the base cell 1 of FIG. 2, and, in a similar manner, the second PMOS transistor 32 corresponds to the second PMOS transistor 15, the first NMOS transistor 33 corresponds to the first NMOS transistor 20 and the second NMOS transistor 34 corresponds to the second NMOS transistor 25.

In a similar manner the base cell 1 according to the disclosure can be used for implementing other complex cells, such as a multiplexer and a flip-flop, keeping the same efficiency for the simple base cells, such as NAND and NOR gates, an inverter, and a buffer.

As an example, a more complex cell, like a flip-flop, can be implemented starting from the base cell 1 using the routing metal layers to connect more base cells and thus obtaining a more complex structure having more than four transistors, as in the case of a flip-flop.

Advantageously, it is also possible to construct complex cells for the ECO implementation using a small cluster of cells, composed by few and close base cells, according to the disclosure, which are able to implement more complex functions by using more than four transistors. In this manner, the percentage of filler cells that can be used as ECO cells is increased.

Figures 4A, 4B:
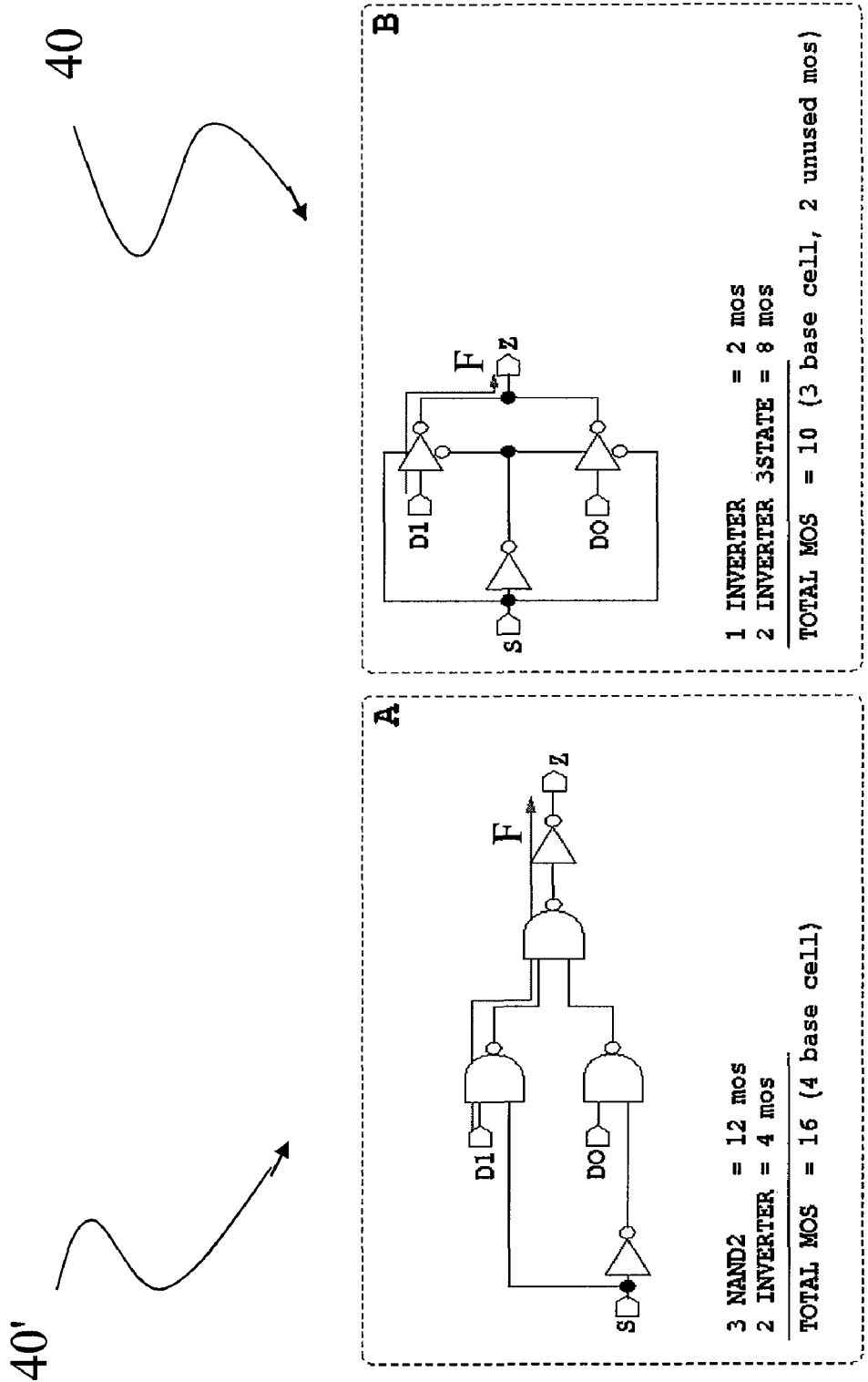
FIG. 4A shows a schematic view of an inverting multiplexer implemented starting from the prior art base cell of FIG. 1.
FIG. 4B shows a schematic view of an inverting multiplexer implemented starting from the base cell of FIG. 2.

As an example, a gate level implementation of an inverting multiplexer 2:1 (two inputs:one output), based on the composition of the available ECO libraries cells, is shown in FIGS. 4A and 4B. In particular, FIG. 4A shows an inverting multiplexer 40' implemented starting from a prior art ECO base cell as the base cell 100 described in the above-referenced U.S. patent publication no. US 2005/0235240. In particular, the inverting multiplexer 40' includes three NAND cells and two inverter cells, the total including sixteen MOS transistors and consequently four base cells.

Advantageously, as shown in FIG. 4B, an inverting multiplexer 40 can be obtained starting from the base cell 1 according to the disclosure. The inverting multiplexer 40 includes one inverter cell and two inverter three-state cells, the total including ten MOS transistors and consequently three base cells with two unused transistors. In this way, the implementation of the inverting multiplexer 40 according to the disclosure, as shown in FIG. 4B, reduces the related occupation area.

Advantageously according to the disclosure, the signal propagation path is also reduced and the timing performance is increased since the number of logic gates through which the signal flows is reduces, as indicated by the arrows F in FIGS. 4A and 4B which show that such a number is reduced from three (FIG. 4A) to two (FIG. 4B).

Similar considerations can be done for implementation of other complex cells, like a flip-flop.

In conclusion, the ECO base cell according to the disclosure requires an unmodified metal contact layer for the customization. As a consequence of the fact that all the front-end masks are fixed, the regularity and the yield during the production process are increased. In particular, ECO customization needs one less mask modification, reducing the fabrication time and the costs and increasing the yield without a penalty in terms of logic-cell routability.

Moreover, the ECO base cell according to the disclosure is much more efficient in terms of occupation area in the mapping of complex logic cells compared to the prior art cells. In fact, using this base cell according to the disclosure makes it possible to realize an ECO implementation with a small cluster of base cells, and for this reason the percentage of filler cells which can be used as ECO cells increases. As a consequence, both the flexibility of use of the ECO base cell and the possibility of making a local correction, close to a wrong logic area, are increased.

Another advantage of the ECO base cell according to the present disclosure is the reduced signal propagation path and consequently the efficiency in terms of timings performance.

Moreover, the ECO base cell according to the disclosure allows to implement a large number of compact logical functions, reducing the routing overhead required for an ECO implementation.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

Obviously, a technician of the field, aiming at meeting incidental and specific needs, will bring several modifications to the above described cell, all within the scope of protection of the disclosure as defined by the following claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A base cell for an Engineering Change Order (ECO) implementation, comprising: at least a first pair of CMOS transistors and a second pair of CMOS transistors, the at least first pair of CMOS transistors have a common gate and said at least second pair of CMOS transistors have separate gates, the base cell having undefined functionality.

2. The base cell of claim 1 having one fixed contact layer over each active area that is structured to make connections to form a functional cell.

3. The base cell of claim 1, comprising first and second PMOS transistors and first and second NMOS transistors, said at least first pair of CMOS transistors comprising said second PMOS transistor and said first NMOS transistor while said at least second pair of CMOS transistors comprises said first PMOS transistor and said second NMOS transistor.

4. The base cell of claim 3 wherein said first PMOS transistor has a source region isolated from all other MOS transistors with a source terminal, a dedicated gate region having a gate terminal and a drain region connected with the drain region of said second PMOS transistor through a common drain terminal.

5. The base cell of claim 4 wherein said second PMOS transistor has a source region isolated from all other CMOS transistors with a source terminal.

6. The base cell of claim 3 wherein said first NMOS transistor and said second PMOS transistor have a common gate region with a common gate terminal.

7. The base cell of claim 6 wherein said first NMOS transistor has a source region isolated from all other CMOS transistors with a source terminal and a drain region connected with the drain region of said second NMOS transistor with a common drain terminal.

8. The base cell of claim 7 wherein said second NMOS transistor has a source region isolated from all other CMOS transistors with a source terminal and a dedicated gate region having a gate terminal.

9. A complex cell for an Engineering Change Order (ECO) implementation, comprising: a small cluster of base cells, each base cell comprising: at least a first pair of CMOS transistors and a second pair of CMOS transistors, the at least first pair of CMOS transistors having a common gate and said at least second pair of CMOS transistors having separate gates, each base cell having undefined functionality.

10. The cell of claim 9 having a fixed contact layer over each active area that is structured to make connections to form a functional cell.

11. The cell of claim 9, comprising first and second PMOS transistors and first and second NMOS transistors, said at least first pair of CMOS transistors comprising said second PMOS transistor and said first NMOS transistor while said at least second pair of CMOS transistors comprises said first PMOS transistor and said second NMOS transistor.

12. The cell of claim 11 wherein said first PMOS transistor has a source region isolated from all other MOS transistors with a source terminal, a dedicated gate region having a gate terminal and a drain region connected with the drain region of said second PMOS transistor through a common drain terminal.

13. The cell of claim 12 wherein said second PMOS transistor has a source region isolated from all other CMOS transistors with a source terminal.

14. The cell of claim 11 wherein said first NMOS transistor and said second PMOS transistor have a common gate region with a common gate terminal.

15. The cell of claim 14 wherein said first NMOS transistor has a source region isolated from all other CMOS transistors with a source terminal and a drain region connected with the drain region of said second NMOS transistor with a common drain terminal.

16. The cell of claim 15 wherein said second NMOS transistor has a source region isolated from all other CMOS transistors with a source terminal and a dedicated gate region having a gate terminal.

17. A device, comprising:
a base cell comprising a first pair of complementary MOS transistors and a second pair of complementary MOS transistors, the first and second pairs of transistors formed of patterns of material layers that is asymmetrical with respect to a longitudinal middle axis of the base cell, the first pair of transistors have a common gate and the second pair of transistors have separate gates, the base cell having a fixed contact layer over each active area that is structured to make connections to form a functional cell, the base cell having no defined functionality.

18. The circuit of claim 17 wherein the first and second pairs of transistors comprise first and second PMOS transistors and first and second NMOS transistors in which the first pair of complementary MOS transistors comprise the second PMOS transistor and the first NMOS transistor, and the second pair of complementary MOS transistors comprises the first PMOS transistor and the second NMOS transistor, and wherein the first PMOS transistor has a source region isolated from all other MOS transistors with a source terminal, a dedicated gate region having a gate terminal and a drain region connected with the drain region of the second PMOS transistor through a common drain terminal, and the second PMOS transistor has a source region isolated from all other MOS transistors with a source terminal.

19. The circuit of claim 18 wherein the first NMOS transistor and the second PMOS transistor have a common gate region with a common gate terminal.

20. The circuit of claim 18 wherein the first NMOS transistor has a source region isolated from all other MOS transistors with a source terminal and drain region connected with the drain region of the second NMOS transistor with a common drain terminal, and the second NMOS transistor has a source region isolated from all other MOS transistors with a source terminal and a dedicated gate region having a gate terminal.

* * * * *